US007777506B2

(12) United States Patent
Ernest et al.

(10) Patent No.: US 7,777,506 B2
(45) Date of Patent: Aug. 17, 2010

(54) HIGH-VOLTAGE GENERATOR FOR AN X-RAY APPARATUS COMPRISING A HIGH-VOLTAGE MEASUREMENT DEVICE

(75) Inventors: Philippe Ernest, Gif sur Yvette (FR); Laurence Abonneau-Casteignau, La-Celle-les-Bordes (FR); Florent Liffran, Paris (FR)

(73) Assignee: General Electric Company, Schenectady, NY (US)

( * ) Notice: Subject to any disclaimer, the term of this patent is extended or adjusted under 35 U.S.C. 154(b) by 444 days.

(21) Appl. No.: 11/943,327

(22) Filed: Nov. 20, 2007

(65) Prior Publication Data

US 2008/0122461 A1 May 29, 2008

(30) Foreign Application Priority Data

Nov. 28, 2006 (FR) .................................. 06 55167

(51) Int. Cl.
*G01R 27/08* (2006.01)
*H05G 1/10* (2006.01)

(52) U.S. Cl. ...................................... 324/713; 378/101

(58) Field of Classification Search ................. 324/713; 378/101

See application file for complete search history.

(56) References Cited

U.S. PATENT DOCUMENTS

| | | | | |
|---|---|---|---|---|
| 3,872,373 | A * | 3/1975 | Saito et al. | 323/282 |
| 5,652,521 | A * | 7/1997 | Meyer | 324/551 |
| 6,285,538 | B1 * | 9/2001 | Krahn | 361/87 |
| 6,715,198 | B2 * | 4/2004 | Kawakami | 29/595 |
| 2008/0122425 | A1 * | 5/2008 | Ernest et al. | 324/72 |

FOREIGN PATENT DOCUMENTS

| | | | |
|---|---|---|---|
| DE | 20 37 828 | A1 | 2/1972 |
| DE | 195 37 155 | A1 | 4/1997 |
| DE | 198 41 164 | A1 | 3/2000 |

* cited by examiner

*Primary Examiner*—Jeff Natalini
(74) *Attorney, Agent, or Firm*—Global Patent Operation

(57) ABSTRACT

A high-voltage generator of an X-ray apparatus comprises a high-voltage measurement device. The measurement device comprises a compact component comprising both the measurement resistor and a film capacitor used both to protect said resistor and eliminate the parasitic effects induced by parasitic capacitances of the generator. The film capacitor is made in insulating films by a sequence of metalized strips and insulating strips. The films are positioned relative to one another in such a way that the film capacitor is formed by series-mounted discrete capacitors. To this end, between two successive films, the width of the bottom strips of the film crosses two metalized strips of the top film.

15 Claims, 3 Drawing Sheets

HIGH-VOLTAGE GENERATOR FOR AN X-RAY APPARATUS COMPRISING A HIGH-VOLTAGE MEASUREMENT DEVICE

FIELD OF THE INVENTION

Embodiments of the invention provide a high-voltage generator for an X-ray apparatus comprising a high-voltage measurement device. The field of the invention is that of the generation of high voltages and apparatuses using these high voltages. In particular, the field of the invention is that of medical apparatuses for X-ray image acquisition.

It is an aim of the invention to make more compact high-voltage generators.

It is another aim of the invention to enable a precise static and dynamic, aperiodic measurement of the high voltage generated.

PRIOR ART

X-ray apparatuses today are used to obtain images or even sequences of images of an organ situated within a living being, especially a human being. An X-ray apparatus comprises an X-ray tube generally contained in a metal jacket. The X-ray apparatus comprises a high-voltage generator supplying the X-ray tube with energy. This high-voltage generator is contained in an enclosure generally situated at some distance from the X-ray tube. In operating mode, one or more high-insulation cables convey the high voltage up to the jacket containing the X-ray tube.

In the prior art, the generation of X-rays for medical image acquisition requires a supply voltage ranging from 40 kilovolts to 160 kilovolts across the anode and cathode of the X-ray tube. This high voltage is obtained with a bipolar or monopolar generator.

In the case of a bipolar generator, two voltages symmetrical in relation to ground are applied to the tube. The high voltage given by the generator is regulated here in controlling the sum of the two high voltages namely the positive and negative voltages, applied respectively to the anode and to the cathode. In this case, the two high voltages are measured by two identical measurement devices.

In the case of a monopolar generator, the high voltage is regulated by controlling the voltage applied to the cathode. In this case, the high voltage is measured by a single measurement device. These high-voltage measurement devices are used to divide the voltage measured in a ratio of the order of 10 000, i.e. generally one volt for 10 kilovolts.

One example of a prior-art high-voltage measurement device is shown in FIG. 1. In the example of FIG. 1, the measurement device 1 is immersed in an insulating fluid, generally oil. The device 1 has a high-value resistor R1, with resistance of the order of some hundreds of megohms (MΩ). One end E1 of this resistor R1, commonly called a high-voltage measurement perch resistor, is connected to an impulse generator 2 giving the high voltage to be measured. Another end E2 of this resistor R1 is connected to a resistor R2 with a value of some tens of kiloohms (kΩ), commonly called a bleeder foot resistor.

Through this bleeder, thus connected to a bleeder foot resistor, a voltage divider bridge is made. The voltage at the terminals of the bleeder foot resistor is generally a $1/10000^{th}$ portion of the high voltage to be measured.

However, this type of measuring device has drawbacks. Indeed the build-up time of the pulse given by the generator is very short. It generally lasts 1 millisecond or even 0.5 milliseconds depending on the types of generator. The pulse response given by the measuring device during this build-up time comprises imperfections. In FIG. 2, a graph illustrates an example of a pulse response of the prior-art measuring device.

In the graph of FIG. 2, the curve 3 of the pulse response of the measuring device is represented in terms of Cartesian coordinates. The x-axis represents the time in milliseconds and the y-axis represents the voltage in volts. At the instant t0, the generator delivers a voltage for example of 100 kilovolts. The measuring device of FIG. 1 gives a response comprising sub-oscillations that last 1.5 milliseconds up to the instant t1. These sub-oscillations are due to the charging time of the cables of the generator.

The pulse response given with this type of device has imperfections. These imperfections are due to parasitic capacitances present firstly in the generator and secondly in the high-voltage cables of the generator. These parasitic capacitances with the measurement resistor behave like a resistor-capacitor circuit in pulse mode. These parasitic capacitances have a value that is not controlled and is non-linear.

To resolve this problem, there are prior-art approaches for coping with these sub-oscillations of the transient responses of the device.

In a first classic approach, a capacitive divider is added to the measurement device. This capacitive divider comprises capacitors with controlled capacitive values. With this approach, the theoretical pulse response of the device gets balanced with the capacitors at $t=0$ and with the resistors of the device at $t=\infty$ prompting a perfect pulse response from the device. In practice, the residual parasitic capacitances generate sub-oscillations. The greater the increase in the capacitance of the capacitor, the greater is the increase in the residual defects of the transient response.

In another approach, the size of the system is increased to reduce the influence of the parasitic capacitances. The amount of space taken up by the measurement device is then incompatible with the compactness required for an X-ray apparatus especially in the case of a mobile apparatus.

At present, all the measurement devices enabling perfect high-voltage measurement during a transient phase lasting one millisecond are either prohibitively sized or complex or even difficult to implement.

SUMMARY OF THE INVENTION

Embodiments of the invention are aimed precisely at overcoming the drawbacks of the techniques explained here above. To this end, an embodiment of the invention proposes a high-voltage measurement device for which the geometrical layout of the components causes the elimination of the effects of the parasitic capacitors distributed all along the bleeder with the high voltage and with the ground potential. Thus, the measurement given by this measurement device is not dynamically falsified by the parasitic capacitances as it is in the prior art.

In an embodiment of the invention, the measurement device comprises capacitors laid out in such a way that, around the measurement resistor, also called a bleeder, they generate an electrical field for which the development of the potential is similar to that generated in steady operation mode regime by the resistor alone.

To this end, one arrangement consists in distributing the capacitors into two parallel rows, each row defining a plane. The space between the two rows is sufficient to enable the bleeder to be placed therein. The making of the capacitors is such that, between the two rows, the potential increases all along the row similarly to the internal potential of the bleeder.

The bleeder is formed either by series-connected resistors or by a resistor screen-printed on a ceramic plate or cylinder.

In an embodiment of the invention, the capacitors are made on insulating films by a succession of metallized strips or insulating strips. The films are positioned relative to one another in such a way that the capacitors are discrete and series-connected in two parallel rows.

To this end, between two successive films, the width of the metallized strips of the bottom film crosses two metallized strips of the top film. This arrangement of the films and the electrical connection between the capacitors is such that the potential increases in stages all along the row of capacitors similarly to the internal potential of the bleeder.

An embodiment of the invention is aimed at the integration, on a same component, of a capacitive divider formed by the capacitors made on the films and a measurement resistor. The result obtained is a measurement resistor that is protected and entirely integrated.

The layout and the connection of the measurement resistor and of the capacitors are such that the voltage across the component is linear. The electrostatic and electrical potential are identical at each point of the component, thus ensuring a good transient response. An embodiment of the invention enables the component to be protected against electrostatic disturbances if any. To this end, the distance between the films of the capacitor and the ceramic of the resistors is very small.

While providing tight protection to the measurement resistor, the device also provides an almost perfect pulse response, exactness in the response given and speed of measurement. Similarly, the measurement resistor may have higher values in order to reduce losses if any, without thereby disturbing the measurement made. The measurement device of embodiments of the invention may be placed anywhere in the high-voltage generator.

The technology of the film capacitor used in embodiments of the invention enables automated winding, manufacturing and reduced costs. It also provides for a wide range of choice of the capacitance values of the capacitors while at the same time keeping the same volume of space requirement and the same cost of manufacture. With the invention, it is not necessary to insert the measurement resistor during the manufacture of the film capacitor. The measurement resistor is easy to integrate into the film capacitor. This provides for perfect repeatability in manufacture and many possibilities of positioning in the high-voltage generator.

Embodiments of the invention thus provide firstly for the tight protection of the measurement resistor. Furthermore, a space for the circulation of insulating and cooling fluid is left between the film capacitor and the measurement resistor.

An embodiment of the measurement device of the invention consists of commonly used, low-cost components making its manufacture simple and inexpensive.

Advantages of the invention may include, but are not limited to:

efficient transient response, immunity against noise, enabling any position of the measurement device in the high-voltage generator, repeatability through the production lines, and low cost due to the technology of the insulating film.

More specifically, an embodiment of the invention may provide a high-voltage generator of an X-ray device having a high-voltage measurement device connected to the terminals of the high-voltage generator and comprising at least one measurement resistor and several capacitors distributed around the measurement resistor, wherein each of the several capacitors is a film capacitor, the film capacitor has at least two insulating films wound about a hollow tube, wherein the measurement resistor is inserted in the hollow tube, wherein each insulating film has a succession of metallized strips and insulating strips, wherein metallized strips of a bottom film overlap two metallized strips of a film directly above, the top film being the film closest to a surface of the tube.

Embodiments of the invention may also comprise one or more of the following characteristics:

- the measurement resistor is round with a diameter smaller than that of the tube.
- the capacitors are distributed among discrete series-mounted components.
- the width of the metallized strips is greater than or equal to the width of the insulating strips.
- the measurement resistor is made on resistive and discrete components.
- the measurement resistor is formed by a screen-printed resistive component.
- the measurement resistor is formed by a resistive component obtained by laser.
- the metallized strips are made of a screen-printed metal.
- the metallized strips are formed by a metal deposit on the insulating film.
- the metallized strips are made of copper or aluminium.
- the measurement device comprises a flattened film capacitor into which a flattened measurement resistor is inserted.
- the minimum width of the metallization strips is determined as a function of an electrical insulation parameter depending on the thickness of the metallization, the number of strips and the thickness of the ceramic film.
- the film capacitor is parallel-connected to the measurement resistor, the measurement device comprises a balancing capacitor (C) connected to a measurement point of the measurement device and to a ground (M).
- the balancing capacitor (C) has a capacitance far below the capacitance of the film capacitor.
- the film capacitor is connected to the generator at a connection point different from that of the measurement resistor, and is connected to ground.

BRIEF DESCRIPTION OF THE DRAWINGS

Embodiments of the invention will be understood more clearly from the following description and from the accompanying figures. These figures are given by way of an indication and in no way restrict the scope of the invention.

DETAILED DESCRIPTION OF EMBODIMENT OF THE INVENTION

Figure 1:
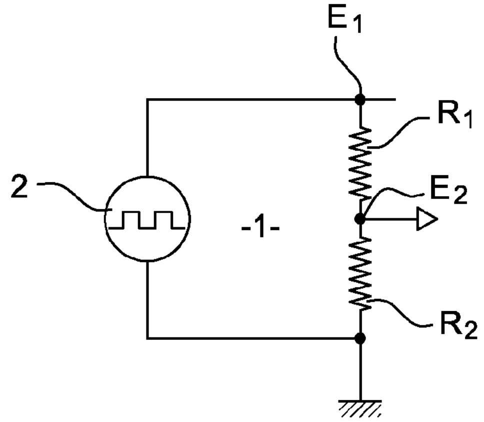
FIG. 1, already described, is a schematic representation of a prior-art high-voltage measurement device.
Figure 2:
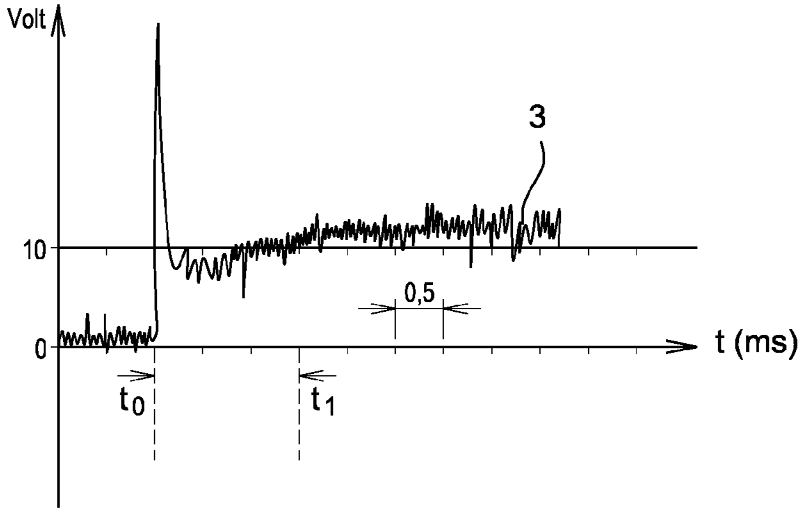
FIG. 2, already described, is a graph showing a pulse response given by the prior-art measurement device.
Figure 3:
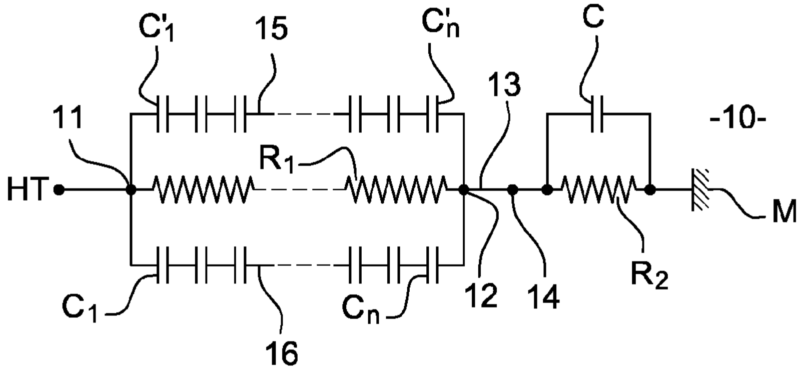
FIG. 3 shows a first electronic assembly of a high-voltage measurement device provided with the improved means of the invention.

FIG. 3 shows a high-voltage measurement device 10 provided with improved means of the invention. FIG. 3 shows a first mode of connection of capacitors series-mounted in the measurement device 10 and producing an electrical field suited to the implantation of the measurement resistor. The implementation of the discrete, series-mounted capacitors is described with reference to FIG. 7.

The measurement device 10 is placed in a high-voltage generator (not shown) of an X-ray tube in order to regulate the high-voltage given by said generator. The measurement device 10 gives a pulse response proportional to the voltage delivered by the generator. In a preferred embodiment, the measurement device 10 divides the measured high voltage in a ratio of 10 000, i.e. generally one volt for ten kilovolts of the high voltage delivered by the generator. The measurement device 10 is immersed in an insulating fluid which is generally oil.

The measurement device 10 comprises a round or flat high-value measurement resistor R1 with a high value of the order of some hundreds of megohms. In one example, the resistance value of the measurement resistor R1 is equal 200 megohms. The measurement resistor R1 has a first end 11 connected to the high-voltage generator. This measurement resistor R1 is commonly called a high-voltage measurement bleeder. The measurement resistor R1 has a second end 12 series-connected to a resistor R2 with a value of some tens of kiloohms connected to ground M. In one example, the resistor R2 is equal to 10 kiloohms. The resistor R2 is commonly called a bleeder foot resistor.

The connection between the measurement resistor R1 and the bleeder foot resistor R2 can be made with a sheathed wire 13. In one example, the bleeder foot resistor R2 may be situated outside the insulating fluid of the generator. In the example of FIG. 3, the measurement resistor R1 has a resistance value 10 000 times greater than that of the bleeder foot resistor R2. This means that the voltage measured at the measuring point 14 situated between the two resistors R1 and R2 is 10000 times lower than the voltage delivered by the generator.

However, owing to the parasitic capacitances internal to the generator and the capacitances of the sheathed cables of the generator, parasitic effects disturb the transient response of the measurement device 10. In order to eliminate these parasitic effects, the measuring device 10 has discrete, series-mounted capacitors C1 to Cn and C'1 to C'n. These capacitors C1 to Cn and C'1 to C'n are capable of compensating for the parasitic effects.

The capacitance of the series-mounted capacitors C1 to Cn and C'1 to C'n is greater than the parasitic capacitances. The higher this value, the greater the control over the potentials created and the lower the influence of this value on the measurement resistor R1. However, a compromise must be made in determining the capacitance of the capacitors C1 to Cn and C'1 to C'n. For, the greater the capacitance of the capacitors C1 to Cn and C'1 to C'n, the greater the possibility that the measurement might include residual defects. In one example, the capacitance of the capacitors C1 to Cn and C'1 to C'n ranges from 1 to 100 picofarads.

The capacitors C1 to Cn and C'1 to C'n are film capacitors. This type of capacitor is obtained by winding. The capacitors C1 and C'1 represent a capacitance surrounding the measurement resistor R1, and so on and so forth up to Cn and C'n. The two rows of capacitors C1 to Cn and C'1 to C'n are a symbolic representation to show that the resistor R1 is surrounded by capacitances on all sides. In reality, each capacitor surrounds R1.

The space at the middle of the cylindrical capacitors is sufficient to enable the measurement resistor R1 to be placed therein.

Figure 4:
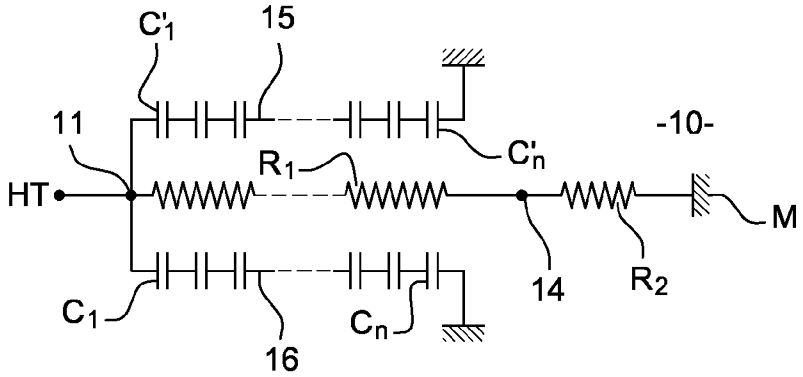
FIG. 4 shows a second electronic assembly of a high-voltage measurement device provided with the improved means of the invention.

FIGS. 3 and 4 shows two modes of connection of the rows 15 and 16 of the capacitors C1 to Cn and C'1 to C'n to the high-voltage generator and to ground M. In the example of FIG. 3, the row 15 of the series-mounted capacitors C1 to Cn is parallel-connected to the measurement resistor R1. Similarly, the row 16 of the series-mounted capacitors C'1 to C'n is parallel-connected to the measurement resistor R1. With this type of connection, the pulse response of the other device gets balanced with the capacitors at t=0 and with the measurement resistor R1 of the device at prompting a resistance-capacitance pulse response from the device. To eliminate the residual defects of the transient response, the capacitance of the capacitors C1 to Cn and C'1 to C'n is balanced with a balancing capacitor C parallel-connected with the perch foot resistor R2. In the example of FIG. 3, this type of connection enables compensation for the parasitic capacitances that will exist through the measurement resistor R1. The balancing capacitor (C) has a capacitance greatly below the capacitance of the film capacitor.

In the example of FIG. 4, the rows 15 and 16 of the series-mounted capacitors C1 to Cn and C'1 to C'n are connected to the high-voltage generator and to ground M. In the preferred example, the rows 15 and 16 of the capacitors C1 to Cn and C'1 to C'n are connected to the generator at a point different from that of the measurement resistor R1. With this type of assembly, it is not necessary to balance the capacitance of the capacitors C1 to Cn and C'1 to C'n as in the example of FIG. 3. With this type of connection of the capacitors C1 to Cn and C'1 to C'n, very high tolerance is obtained for the capacitance of said capacitors.

Figure 5:
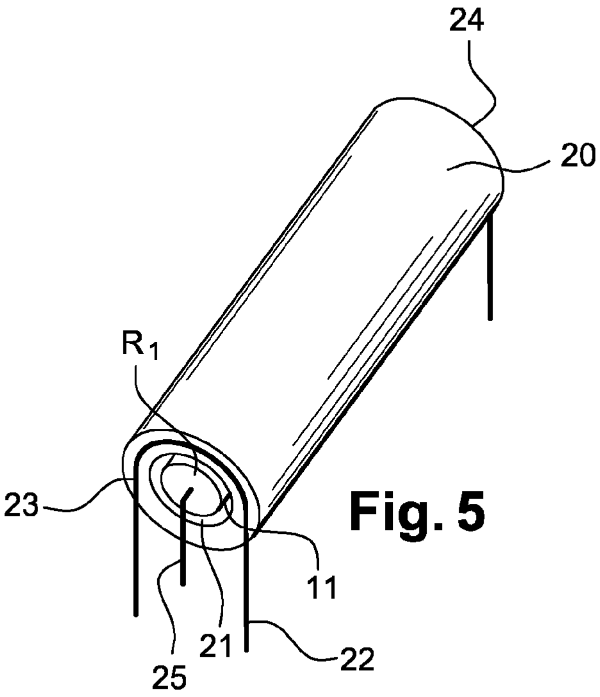
FIG. 5 is a schematic representation of the measurement device of the invention with a round resistor.

FIG. 5 is a schematic view of the measurement device of an embodiment of the invention. In the example of FIG. 5, the measuring device 10 has a film capacitor 20 that is round in shape. This film capacitor 20 is made by a winding about a hollow tube 21. In one example, the hollow tube 21 has a diameter of 18 mm. In one example, the hollow tube 21 may be made of plastic.

Figure 7:
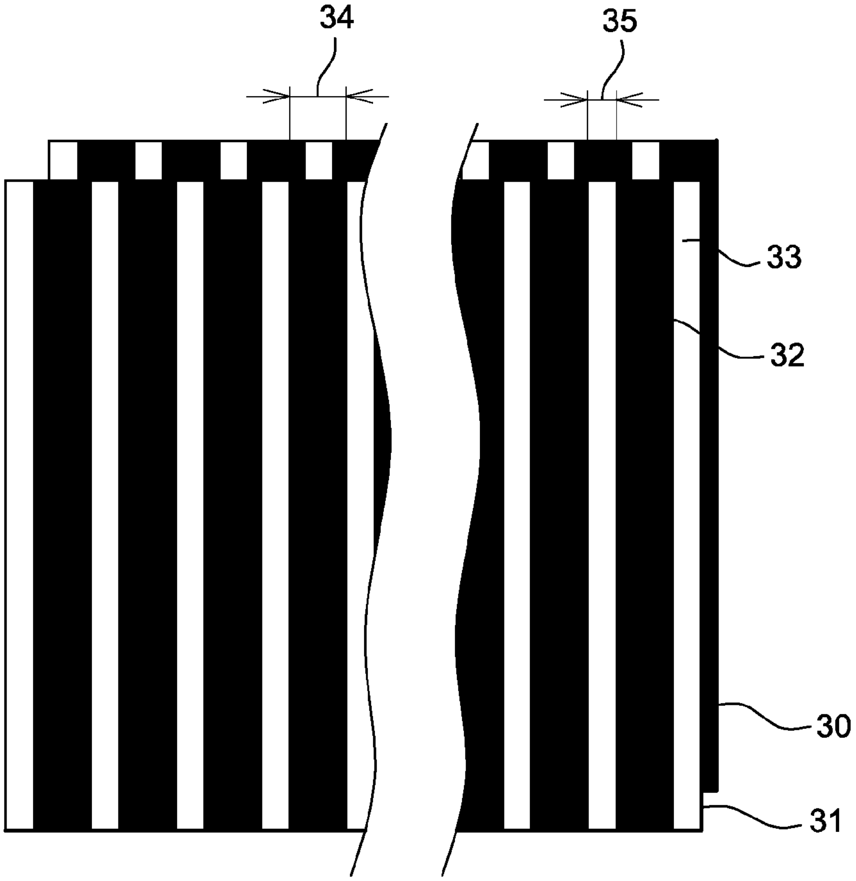
FIG. 7 shows the implementation of the discrete capacitors series-mounted on insulating films according to the invention.

The film capacitor 20 is formed by at least two insulating films as shown in FIG. 7. To obtain series-mounted rows of capacitors, metal armatures are made on the insulating films. One embodiment, according to the invention, of series-mounted discrete capacitors is shown in FIG. 7. The type of capacitor obtained with this type of embodiment is a film capacitor. The dielectric of this capacitor is a film and each of its armatures is formed by a metallized strip. The use of insulating films maintains a temporally optimal measurement result and geometrical stability while at the same time maintaining high mechanical robustness.

The measurement resistor R1 is a round resistor with a diameter smaller than that of the hollow tube 21. One embodiment of the measurement resistor R1 is described in FIG. 8. Connections 22 are placed at the ends 23 and 24 of the film capacitor 20. The measurement resistor has a connection 25 at its ends 11 and 12. These connections 23, 24, 25 are generally obtained by bonding or by soldiering on the components. The measurement resistor R1 is inserted in the hollow tube 21. In order to protect the film capacitor from heat losses of the measurement resistor, the measurement resistor is at a distance of some millimeters from the hollow tube. This space between the hollow tube 21 and the measurement resistor R1 is crossed by a cooling insulating fluid.

With embodiments of the invention, the potential obtained by the measurement resistor R1 and the potential obtained by the capacitive effect of the capacitors is the same. Using a film capacitor enables the measurement resistor R1 to be protected from external disturbances. The measurement resistor R1 is also protected from electrostatic disturbances.

The measurements made by this measurement device of the invention are independent of the position at which it is connected in the generator.

Figure 6:
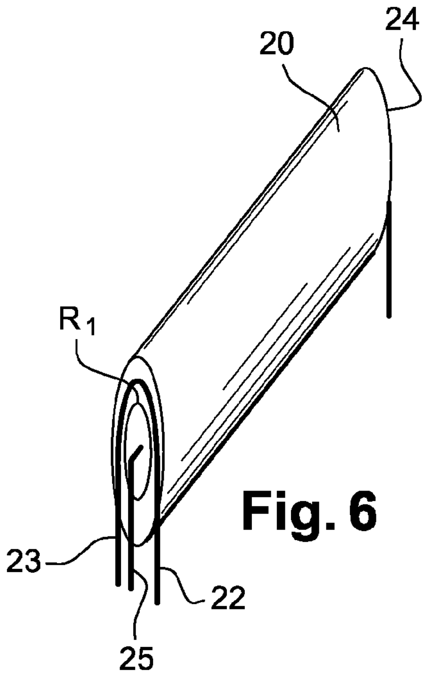
FIG. 6 is another schematic representation of the measurement device of the invention with a flat resistor.

FIG. 6 is a schematic view of another embodiment of the measurement device of the invention. In the example of FIG. 6, the measurement device 10 has a flat-shaped film capacitor 20. In this example, the insulator films wound about the hollow tube 21 of FIG. 5 are flattened. In this case, the measurement resistor R1 to be inserted into the flattened hollow tube 21 is flat.

FIG. 7 shows an embodiment of series-mounted discrete capacitors according to the invention. In the example of FIG. 7, the capacitors are implemented on rectangular insulating films 30. In one example, as illustrated in FIG. 7, the film capacitor is formed by two superimposed, insulating films 30 and 31. In one example, the insulator films 30 have a height of 10 cm for 40 kilovolts. The thickness of the insulator film 30 or 31 is very small. It is a few micrometers. In one example, the insulator film 30 or 31 has a thickness of 40 micrometers.

The insulator films 30 and 31 may be made of paper or plastic. In a preferred embodiment, the insulator films 30 and 31 are made of plastic. The capacitor film may include as many insulator films as necessary, according to the different embodiments of the invention.

In the example of FIG. 7, the insulator films 30 and 31 have a succession of metallized strips 32 and insulating strips 33. The metallized strips 32 are shown here in black and the insulating strips 33 are shown as blanks. The number of insulating films 30 and 31 to be wound about the hollow tube depends especially on the desired capacitance of the capacitors.

The metallized strips 32 may be made with silk-screen printing ink. They may also be made by a bonding of metal film on the film or by vapour phase deposition. In one example, the metallized strips are made with a copper or aluminium or tin material.

In an embodiment of the invention, the width 34 of the metallized strips 32 is greater than or equal to the width 35 of the insulating bands 33. The minimum width 34 needed for the implementation of the invention is determined as a function of an electrical insulation parameter. This insulation parameter depends inter alia on the thickness of the metallized strips 32, the number of strips and the thickness of the films.

In order to obtain discrete and series-mounted capacitors, the metallized strips of a bottom film overlap two successive metallized strips of the film that is directly above. The top film is the closest to the hollow tube. In the example of FIG. 7, the width 34 of each metallized strip 32 of the film 30 crosses two consecutive metallized strips 32 of the film 31, and so on and so forth for the other films situated beneath the film 30.

In general, between two successive films, the metallizations of the bottom film encroach on two consecutive metallizations of the top film.

This type of embodiment of the capacitors gives a high-voltage capacitor that is spatially capable of having a potential that increases in steps. Similarly, the value of the capacitances is totally controlled. Thus, in the invention, the capacitive couplings are geometrically linked. The measurement resistor is integrated into the film capacitor, thus giving a compact component.

Figure 8:
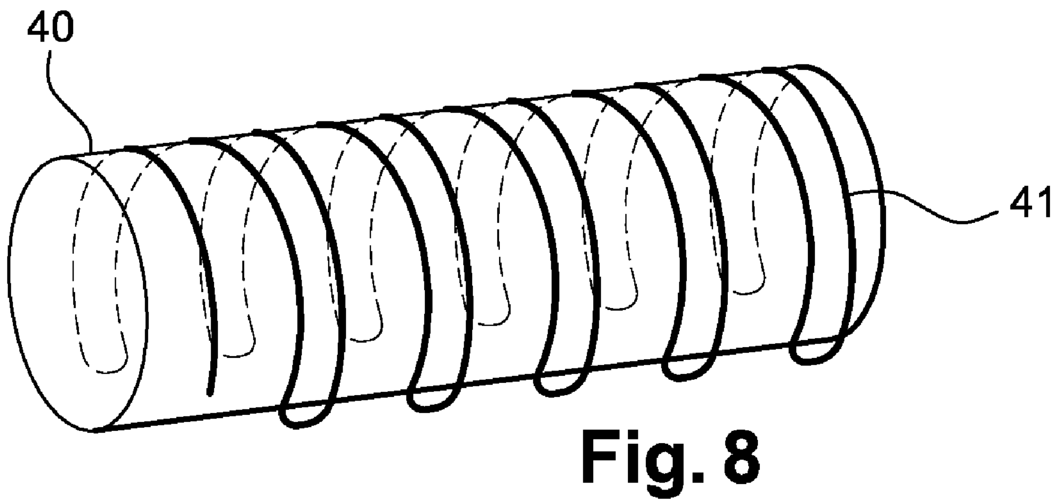
FIG. 8 shows an embodiment of the measurement capacitance of the measurement device.

FIG. 8 shows an embodiment of a round resistor. The measurement resistor R1 is made on an insulating core 40 by means of a resistive winding element 41. In one example, the core 40 is made out of ceramic. This core 40 is cylindrical with a diameter smaller than that of the hollow tube. The resistive winding element 41 may be formed by a helical winding or a spiral winding using silk-screen printing ink. The measurement resistor R1 may be formed by is made on a resistive component obtained by laser on the ceramic core 40. It may also be made by any other means used to obtain a measurement resistor by which the invention can be made.

Figure 9:
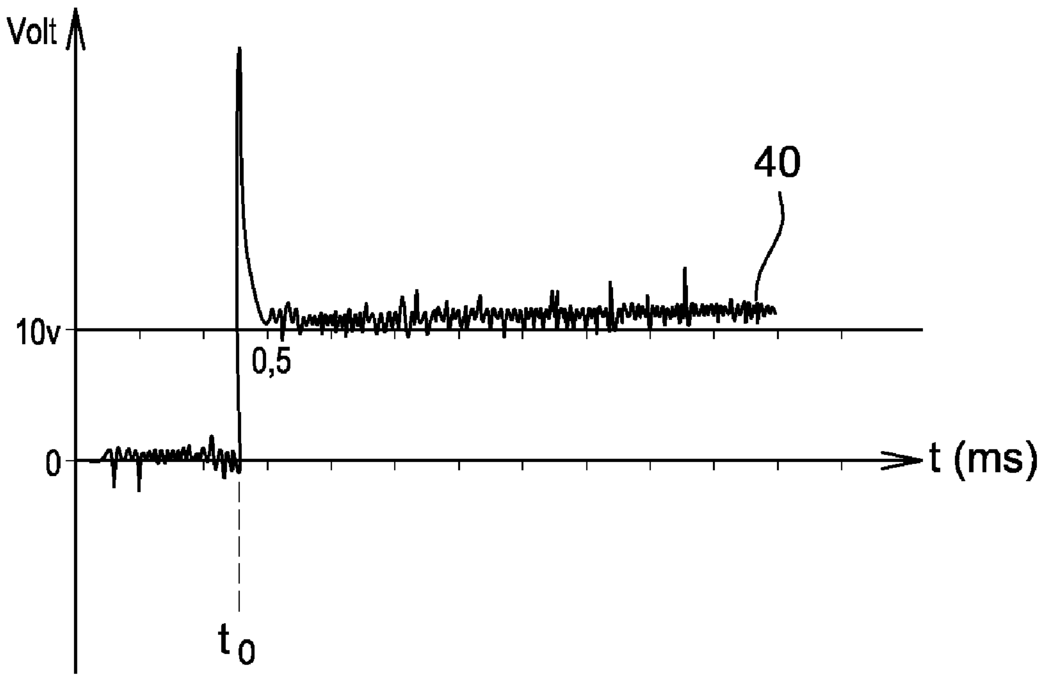
FIG. 9 is a graph showing the pulse response given by the measurement device of the invention.

FIG. 9 is a graph showing a pulse response given by the measurement device of an embodiment of the invention. The curve 40 of the graph of FIG. 7 is represented in Cartesian coordinates. The x-axis represents the time in milliseconds and the y-axis represents the voltage given by the measurement device in volts.

At the instant t0, the high-voltage generator delivers voltage of 100 kilovolts. The measurement device connected to the generator automatically detects this high-voltage and, in a time span equal to 0.5 milliseconds, it gives an almost perfect pulse response of 10 volts.

Embodiments of the invention thus appreciably improve the prior-art measurement devices in terms of both response time and precision of results.

What is claimed is:

1. A high-voltage generator of an X-ray device having a high-voltage measurement device connected to the terminals of the high-voltage generator and comprising at least one measurement resistor and several capacitors distributed around the measurement resistor, wherein each of the several capacitors is a film capacitor, the film capacitor has at least two insulating films wound about a hollow tube, wherein the measurement resistor is inserted in the hollow tube, wherein each insulating film has a succession of metallized strips and insulating strips, wherein metallized strips of a bottom film overlap two metallized strips of a film directly above, the top film being the film closest to a surface of the tube.

2. A generator according to claim 1, wherein the measurement resistor is round with a diameter smaller than that of the tube.

3. A generator according to claim 1, wherein the several capacitors are distributed among discrete series-mounted components.

4. A generator according to claim 1, wherein a width of the metallized strips is greater than or equal to a width of the insulating strips.

5. A generator according to claim 1, wherein the measurement resistor is formed of resistive and discrete components.

6. A generator according to claim 1, wherein the measurement resistor is formed by a screen-printed resistive component.

7. A generator according to claim 1, wherein the measurement resistor is formed of a resistive component made by laser.

8. A generator according to claim 1, wherein the metallized strips comprise a screen-printed metal.

9. A generator according to claim 8, wherein the metallized strips comprises one of copper or aluminium.

10. A generator according to claim 1, wherein the metallized strips comprise a metal deposit on the insulating film.

11. A generator according to claim 1, wherein the measurement device comprises a flattened film capacitor into which a flat measurement resistor is inserted.

12. A generator according to claim 1, wherein a minimum width of the metallization strips is determined as a function of an electrical insulation parameter depending on the thickness of the metallization, the number of metallization strips and a thickness of the ceramic film.

13. A generator according to claim 1, wherein the film capacitor is parallel-connected to the measurement resistor, and wherein the measurement device comprises a balancing capacitor (C) connected to a measurement point of the measurement device and to a ground (M).

14. A generator according to claim 13, wherein the balancing capacitor (C) has a capacitance below a capacitance of the film capacitor.

15. A generator according to claim 1, wherein each film capacitor is connected to the generator at a connection point different from that of the measurement resistor, and is connected to ground.

* * * * *